(12) United States Patent
Fujiwara

(10) Patent No.: US 6,316,280 B1
(45) Date of Patent: Nov. 13, 2001

(54) METHOD OF MANUFACTURING SEMICONDUCTOR DEVICES SEPARATED FROM A WAFER

(75) Inventor: Masatoshi Fujiwara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/271,257

(22) Filed: Mar. 17, 1999

(30) Foreign Application Priority Data

Sep. 7, 1998 (JP) .................................................. 10-252618

(51) Int. Cl.$^7$ ................................................... H01L 21/00
(52) U.S. Cl. ................. 438/31; 438/22; 438/39; 438/942; 438/945

(58) Field of Search .................................. 438/22, 31, 33, 438/34, 39, 460, 462, 465, 942, 945

(56) References Cited

U.S. PATENT DOCUMENTS 4,306,351 * 12/1981 Ohsaka et al. ........................ 438/33

* cited by examiner

*Primary Examiner*—Carl Whitehead, Jr.
*Assistant Examiner*—Christy Novacek
(74) *Attorney, Agent, or Firm*—Leydig, Voit & Mayer, Ltd.

(57) ABSTRACT

A semiconductor device with an improved speed response has a linear ridge pattern including an active layer, a cladding layer, a current blocking layer, and a contact layer on a semiconductor substrate. The insulating layer may be formed in a pattern having a high resistance to dry etching along a longitudinal side of the ridge pattern.

6 Claims, 10 Drawing Sheets

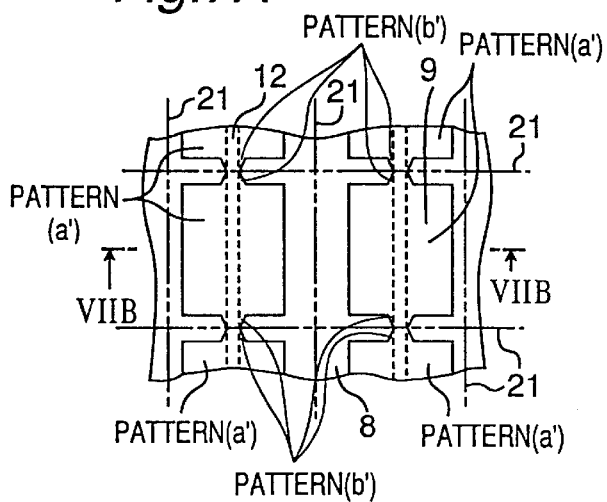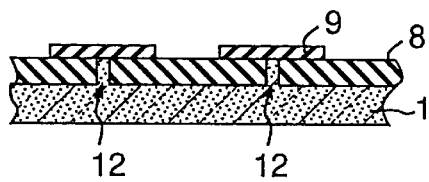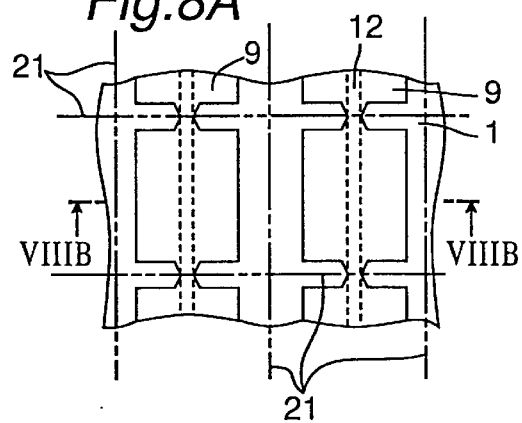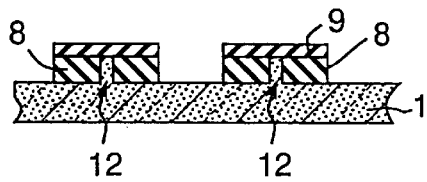

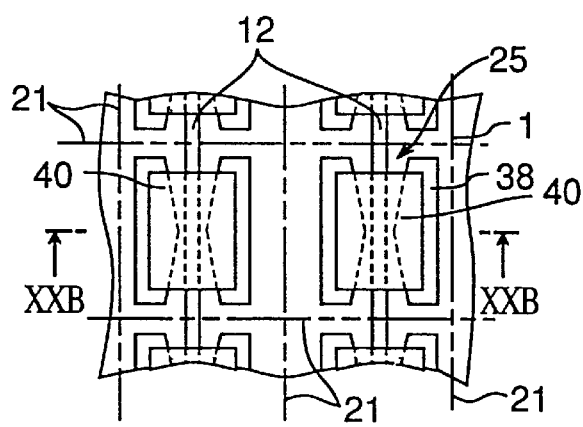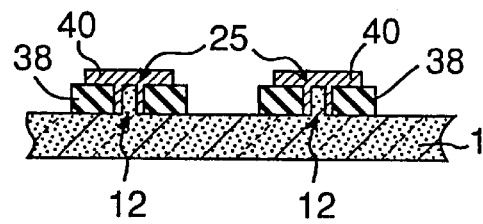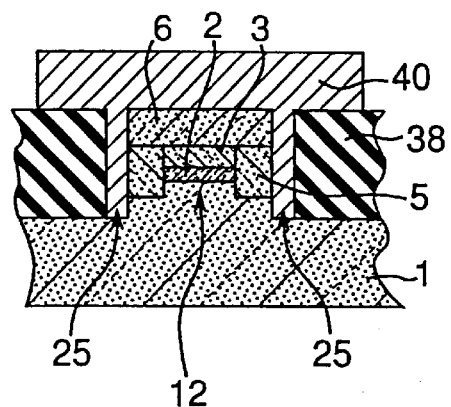

METHOD OF MANUFACTURING SEMICONDUCTOR DEVICES SEPARATED FROM A WAFER

FIELD OF THE INVENTION

The present invention relates to a semiconductor device having faster response and a method for fabricating the same, which is used as a semiconductor laser or a modulator. Particularly, the present invention relates to a method for fabricating a semiconductor device which has a ridge surrounded by an insulating material without any space therebetween.

BACKGROUND OF THE INVENTION

A semiconductor laser generally has high luminous efficiency and is easily miniaturized. In connection with the development of network communication, a semiconductor laser having mass communication competence and rapid response has been recently demanded in the field of optical communication. For example, in optical communication using an optical fiber, adapting a semiconductor laser to various applications for high power output has been widely studied. Since the conventional optical fiber has a minimum loss wavelength of 1.5 μm, a semiconductor laser emitting light having a wavelength of about 1.5 μm has been mainly used. Among such lasers, a distributed feedback laser (abbreviated as "DFB") including a multiple quantum well (abbreviated as "MQW") configuration in an active layer provides quick response and oscillates in a dynamic single mode, i.e. oscillates at only one wavelength using a pulsed drive, at a low threshold current. Therefore, DFB lasers have been used as semiconductor laser diodes for high response long-distance communication.

One example of a semiconductor laser used for this purpose includes an embedded dielectric layer and is called a ridge type semiconductor laser. The ridge type semiconductor laser has an advantage in that the growth processes are completed in a single step and there are no difficult processes to be controlled, such as diffusion of an impurity and the like.

An exemplary prior process for producing such a semiconductor laser is shown in FIGS. 11A to 20C. Primarily, as shown in FIGS. 11A to 11I, a linear ridge pattern 12 is produced by a technique well known in the art. In FIG. 11A, an active layer 2, comprising multilayers of InP, is formed on a p-InP semiconductor substrate 1, and then a cladding layer 3 of n-InP is formed thereon. Examples of the p-InP semiconductor substrate include a InP semiconductor substrate doped with a Group II element, such as zinc. The impurity concentration in the substrate is preferably equal to or lower than $5 \times 10^{-18}/cm^3$. The thickness of the InP active layer 2 and the cladding layer 3 may be about 0.1 μm and about 1 to 2 μm, respectively. The active layer 2 generally contains no impurity, i.e., is undoped. The cladding layer 3 may be doped with a Group VI element, such as sulfur, in a concentration equal to or lower than $5 \times 10^{-18}/cm^3$.

Then, on the cladding layer 3, a first insulating layer 4 is provided in a stripe-shaped pattern having a width of several microns, preferably a width of 3.0 to 4.0 μm, using a photolithography process (as illustrated in FIG. 11B). The first insulating layer 4 can be an inorganic material, such as SiO_2, SiN, SiON, and the like, which can be formed by a known method. The thickness of the first insulating layer 4 is preferably within the range of from 200 to several thousand angstroms.

A portion of the substrate 1, the active layer 2 and the cladding layer 3 are etched, employing the pattern of the first insulating layer 4 as a mask, to provide a first ridge 11 as shown in FIG. 11C. The substrate 1, as mentioned above, is generally etched to a depth of approximately five microns to decrease the capacitance of the current blocking layer. The depth etched in this step may vary according to the function of the semiconductor device produced.

Subsequently, current blocking layers 5 including multiple semiconductor layers are formed on opposite sides of the first ridge 11, as shown in FIG. 11D. Then the first insulating layer 4 is removed from the first ridge as shown in FIG. 11E. The current blocking layer 5 may be a conventional material, but can be multi-layers of InP doped with a Group II element, such as zinc, in a concentration equal to or lower than $1 \times 10^{-18}/cm^3$, when the layer is p-type. When the layer is n-type, the current blocking layer 5 can be InP doped with a Group II element, such as sulfur, in a concentration equal to or lower than $1 \times 10^{-18}/cm^3$, or InP doped with iron.

FIG. 11F illustrates formation of a contact layer 6 on the first ridge 11 and the current blocking layer 5. An example of an n-type contact layer may comprise InGaAs or InGaAsP doped with a Group II element, such as sulfur, in a concentration equal to or lower than $1 \times 10^{-19}/cm^3$, wherein the thickness of the layer should be lower than one micron.

FIGS. 11G and 11H show that, on the contact layer 6, a second insulating layer 7 is formed, which is etched using photolithography, to produce a second ridge in a stripe-shaped pattern with a width of several microns, more preferably 10 to 15 μm. The second insulating layer 7 may be formed from the same material as the first insulating layer described above. The insulating layers may be the same or different materials.

Both the contact layer 6 and the current blocking layer 5 and a portion of the substrate 1 are etched, using the pattern of the second insulating layer as a mask, to provide the second ridge 12 in a stripe-shaped pattern, preferably having a width of 10 to 15 μm (see FIG. 11H). Similar to the first ridge, the depth etched in this step may vary according to the function of the semiconductor device produced. Thereafter, the second insulating layer 7 is removed from the contact layer as illustrated in FIG. 11I.

Then, as shown in FIGS. 12A and 12B, a space between the second ridge patterns 12 is filled with an organic dielectric layer 38, generally a polyimide. The organic dielectric layer 38 can be produced by applying an organic dielectric material to the substrate 1 and etching in an oxygen ion plasma until the surface of the dielectric layer 38 is flat, in other words, until the surface of the second ridge 12 is exposed.

Subsequently, in the conventional method, a third insulating layer 39 is formed on the organic dielectric layer 38 and on the ridge pattern 12 as shown in FIGS. 13A and 13B. Generally, the third insulating layer 39 may be formed from an inorganic insulating material, for example, SiO_2, SiN, SiON, and the like, by a well-known method, and may preferably have a thickness between 500 and 4,000 Å. The third insulating layer 39 may have a smaller rectangular pattern, e.g., 250 μm×250 μm, than the size of the final device so it is confined within the borderline 21, e.g., 300 μm×300 μm, as illustrated in FIG. 13A.

The organic dielectric layer 38 is then subjected to dry etching, using the third insulating layer 39 as a mask, in an oxygen asher which uses an oxygen ion plasma for etching, as shown in FIGS. 14A and 14B. After that, the insulating layer 39 is removed, as shown in FIGS. 15A and 15B.

FIGS. 16A and 16B illustrate a surface electrode 40 formed on an exposed surface of the second ridge 12 and the organic dielectric layer 38. Then, a counter electrode 15 is formed on the surface of the substrate 1 opposite the surface having the ridge pattern 12 (see FIG. 17B). As shown in FIGS. 17A and 17B, a semiconductor laser 200 is cut from the wafer along a borderline which comprises an edge parallel to the ridge pattern 12 and another edge corresponding to a cleavage plane, i.e., perpendicular to the former edge, to isolate laser elements from each other.

The semiconductor laser 200 produced by the described conventional method can generate light when a current exceeds a threshold current, depending on the gain of the active layer, upon applying a voltage to the ridge pattern 12 through the electrodes 40 and 15. Between the electrodes 40 and 15, the current blocking layer 5 and the organic dielectric layer 38 constitute a parasitic capacitor of the semiconductor laser device and govern the high speed response of the device, referred to as a high speed pulse response. Accordingly, the semiconductor laser 200 fabricated by the conventional method has a response lower than 60 GHz, when the organic dielectric layer 38 has a low dielectric constant, for example, lower than 1.5, and is located on both sides of the second ridge pattern 12.

In the conventional method, however, it has been found by the present inventors that dry etching rapidly proceeds from the end of the organic dielectric layer 38 along the side of the ridge pattern 12, and that gaps 25 are formed between the ridge pattern 12 and the organic dielectric layer (see FIGS. 18A, 18B, 19A, and 19B). If the gaps 25 are present, in subsequent processing for forming the electrode 40, electrode metal may be deposited not only on the surface of the ridge pattern but on the side thereof as illustrated in FIGS. 20A, 20B, and 20C, which causes problems, such as a short circuit in the device. As a result, productivity is decreased.

SUMMARY OF THE INVENTION

An object of the present invention is to resolve the above problem and, particularly, to provide a method for fabricating a semiconductor device having high speed response by forming an insulating layer in a given pattern, in consideration of rapid over-etching along the side of the ridge pattern.

Accordingly, as shown particularly in FIGS. 1A to 6B, the present invention provides a method for fabricating a semiconductor device, comprising:

depositing an active layer 2 and a cladding layer 3 onto a surface of a semiconductor substrate 1, in that order, and then forming a current blocking layer 5 beside the active layer 2 and the cladding layer 3, followed by covering the cladding layer 3 and the current blocking layer 5 with a contact layer 6, to provide linear ridge patterns 12 in stripe-shaped form on the semiconductor substrate 1 (as illustrated in FIG. 1A);

filling the space between the ridge patterns 12 with an organic dielectric layer 8 in contact with the ridge patterns (as illustrated in FIG. 1B); covering the ridge patterns 12 and the organic dielectric layer 8 with an insulating layer 9 having an etching protecting pattern (b) protruding along the ridge patterns 12 for preventing over-etching along the ridge patterns 12 (as illustrated in FIGS. 2A and 2B);

etching the organic dielectric layer 8 through the insulating layer 9, as an etching mask, in an oxygen ion plasma, leaving the organic dielectric layer 8 in the same form as the insulating layer 9 (as illustrated in FIGS. 3A and 3B);

removing the insulating layer 9 (as illustrated in FIGS. 4A and 4B);

forming surface electrodes 10 in a given location opposite the ridge patterns 12 and the organic dielectric layer 8 (as illustrated in FIGS. 5A and 5B) and further forming a counter electrode 15 corresponding to the surface electrode 10 on the other side of the substrate 1; and cutting the substrate 1 along a borderline 21 parallel or perpendicularly to the ridge patterns 12 to isolate a region including a ridge pattern 12 and the electrode 10 (as shown in FIGS. 6A and 6B), the borderline 21 corresponding to a cleavage plane of the substrate 1.

As shown in FIG. 2A, for the method of the present invention, the insulating layer 9 includes an insulating layer pattern (a) and the etching protecting pattern (b) opposite a linear ridge pattern 12. Particularly, the present invention, as shown in FIG. 9, includes:

an area of the basic insulating layer pattern (a) of the insulating layer 9 being smaller than a resultant semiconductor device confined by borderlines 21; and when a point at which the basic insulating layer pattern (a) contacts a longitudinal side of the ridge pattern 12 is defined as an ideal point O, the etching protecting pattern (b) prevents over-etching from the ideal point O into the inside of the end product device during oxygen etching, and the etching protecting pattern (b) has a length of at least 17.5 to 45 $\mu$m from the ideal point O.

According to the present invention, the use of the insulating layer 9 comprising the basic insulating layer pattern (a) and the etching protecting pattern (b) as a mask in a dry etching process using an oxygen ion plasma effectively inhibits the incursion of oxygen ion plasma from ideal point O along the side of the ridge pattern 12. Thus, over-etching of the dielectric layer 8 beside the ridge pattern 12 is prevented.

In the method of the present invention, after the etching process, a desirable semiconductor device can be obtained by cutting and separating along a cleavage plane of semiconductor substrate and a borderline transverse to the cleavage plane. In the semiconductor device 100 according to the present invention, as shown in FIG. 6B, the organic dielectric layer 8 contacts both longitudinal sides of the ridge pattern 12, excepting the surface corresponding to a portion for forming an electrode 10.

In the method of the present invention, on the cleavage plane of the substrate, there may be a space between the etching protecting pattern (b) of the insulating layer 9 and the ridge pattern 12.

BRIEF DESCRIPTION OF THE DRAWINGS

FIG. 7A is a plan view of a step in another embodiment of a method according to the present invention.

FIG. 7B is a cross sectional view along a line VIIB—VIIB of FIG. 7A.

FIG. 8A is a plan view of an etching process in another embodiment of a method according to the present invention.

FIG. 8B is a cross sectional view along a line VIIIB—VIIIB of FIG. 8A.

FIG. 20A is a plan view of a step in the method of the prior art.

FIG. 20B is a cross sectional view along a line XXB—XXB of FIG. 20A.

FIG. 20C shows an enlarged cross sectional view of the ridge pattern illustrated in FIG. 20B.

DETAILED DESCRIPTION OF THE PREFERRED EMBODIMENTS

The present invention will described in detail with reference to the accompanying drawings.

In FIGS. 1A, 1B, 2A, 2B, 3A, 3B, 4A, 4B, 5A, 5B, 6A and 6B, each step of the method for fabricating a semiconductor device according to the first embodiment of the present invention is illustrated.

Providing a Ridge Pattern

Figure 1A:
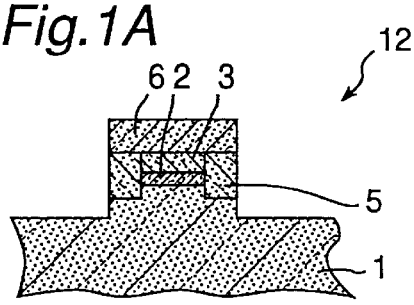
FIG. 1A is an enlarged cross sectional view schematically showing a ridge pattern formed in a method according to the present invention.

In the first step of the method according to the present invention, a linear ridge pattern 12, as shown in FIG. 1A, including an active layer 2, a cladding layer 3, a current blocking layer 5, and a contact layer 6 is produced on a semiconductor substrate 1 in a stripe-shaped form in the same way previously described. The width of the ridge pattern may be generally within the range of 10 to 15 $\mu$m.

Forming An Organic Dielectric Layer

Figure 1B:
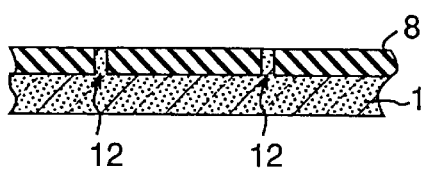
FIG. 1B is a cross sectional view of a step in a method according to the present invention.

Secondly, an organic dielectric layer 8 is formed filling the space between each ridge pattern 12 and in contact with the sides of the ridge pattern 12 as illustrated in FIG. 1B. Generally, the organic dielectric layer 8 of the present invention may be polyimide, but is not limited to polyimide. The thickness of the organic dielectric layer 8 may be the same as the distance from the lowest position of the substrate 1 to the top of the contact layer 6 in the ridge pattern, i.e., it may preferably be between 5 and 8 $\mu$m.

Forming an Insulating Layer

Figure 2A:
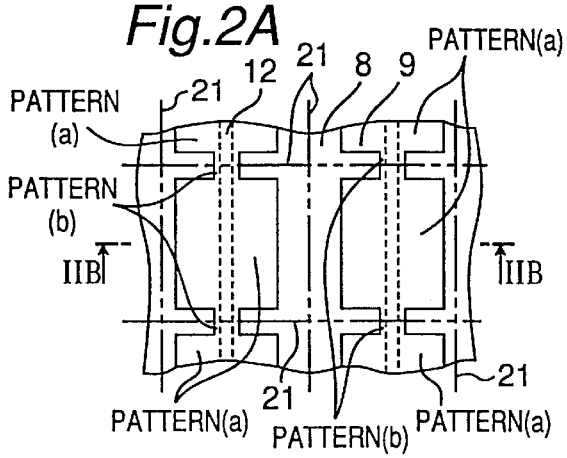
FIG. 2A is a plan view of a step in a method according to the present invention.
Figure 2B:
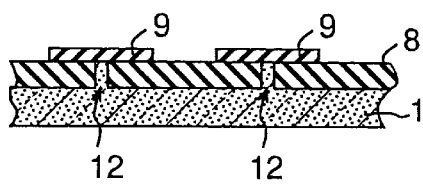
FIG. 2B is a cross sectional view along line IIB—IIB of FIG. 2A.

In the method according to the present invention, then, an insulating layer 9 may be deposited on both the ridge pattern 12 and the organic dielectric layer 8 as shown in FIG. 2A. The insulating layer 9 can have a specific form composed of a basic insulating layer pattern (a) and an etching protecting pattern (b). The basic insulating pattern (a) and the etching protecting pattern (b) may be provided in a symmetrical form relative to the central axis of the ridge pattern 12.

The insulating layer 9 may be an inorganic insulating layer formed from, for example, $SiO_2$, SiN, SiON, and the like. The insulating layer 9 may be formed by depositing the inorganic material by an known method. The thickness of the insulating layer 9 may be generally within a range of 500 to 4,000 Å.

In the present invention, the size of the pattern (a) of the insulating layer 9 over the ridge pattern 12, e.g., 250 $\mu$m×250 $\mu$m, should be smaller than the size of the resultant device, e.g., 300 $\mu$m×300 $\mu$m.

The method according to the present invention includes:
when the insulating layer 9 is called a basic insulating layer pattern (a), and when a point at which the basic insulating layer pattern (a) contacts a longitudinal side of the ridge pattern is defined as an ideal point, forming an etching protecting pattern (b) to avoid over-etching from the ideal point into the end product device during oxygen plasma etching in the next step. The etching protecting pattern (b) has a length of at least 17.5 to 45 $\mu$m from the ideal point.

The width of the etching protecting pattern (b) including a portion above the ridge pattern may be between 50 and 100 $\mu$m.

Figure 10A:
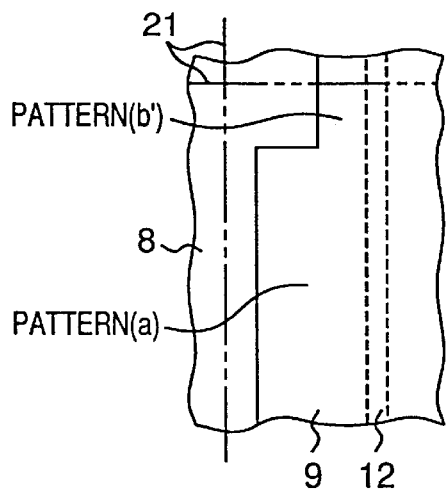
FIGS. 10A, 10B, 10C, 10D, and 10E are plan views showing variations of etching protecting patterns formed in a method of the present invention.
Figure 10B:
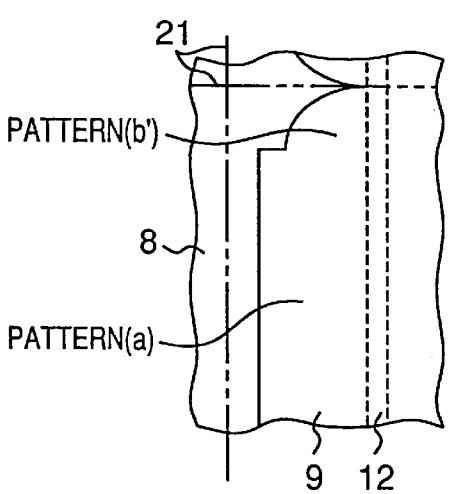
Figure 10C:
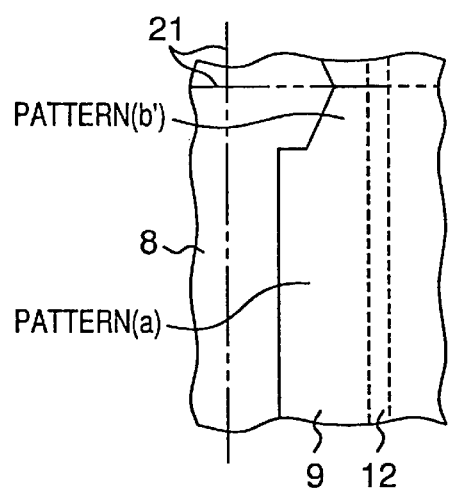

The etching protecting pattern (b) may guard a portion along the side of the ridge pattern within a distance of at least 17.5 to 45 $\mu$m from the ideal point. The etching protecting pattern (b) can have a form such as a rectangle, a triangle, an arcuate shape, a trapezoid, and the like, as shown in FIGS. 10A (b'), 10D (b"), 10B (b'), and 10C (b'), but is not limited thereto, so long as the etching protecting pattern satisfies the above condition.

Figure 10D:
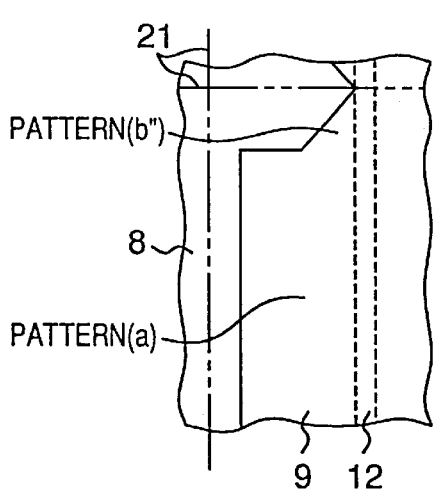
Figure 10E:
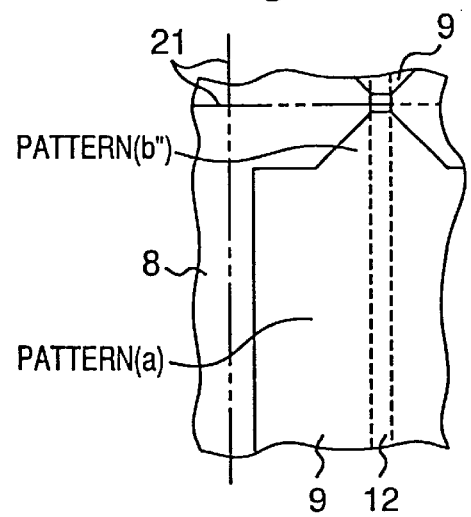
Figure 11A:
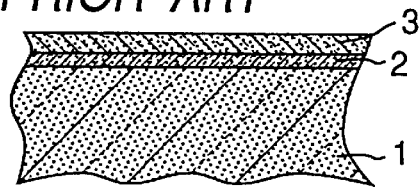
FIGS. 11A to 11I are cross sectional views schematically showing each step of a method known in the prior art.
Figure 11B:
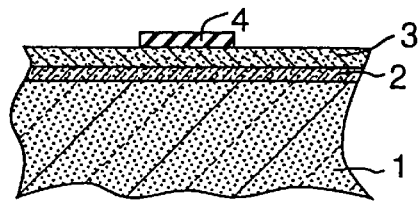
Figure 11C:
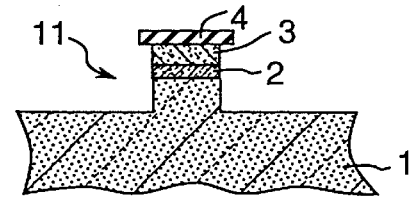
Figure 11D:
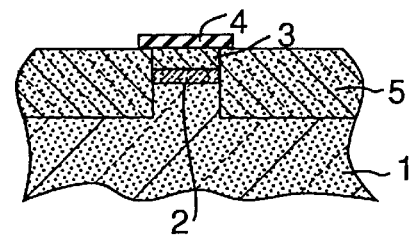
Figure 11E:
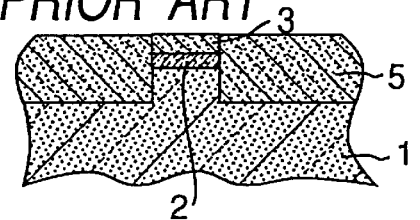
Figure 11F:
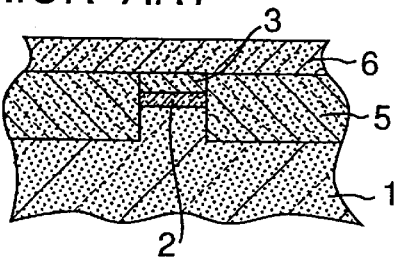
Figure 11G:
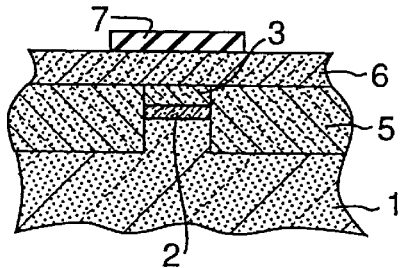
Figure 11H:
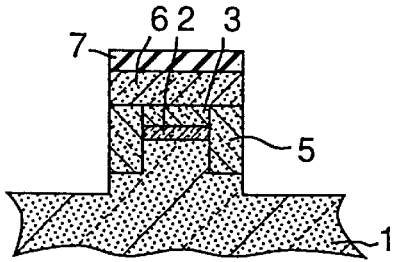
Figure 11I:
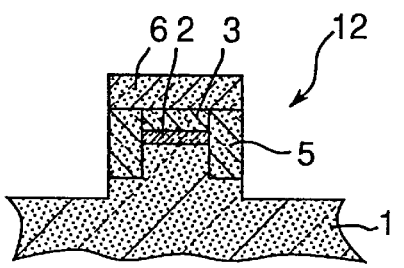
Figure 12A:
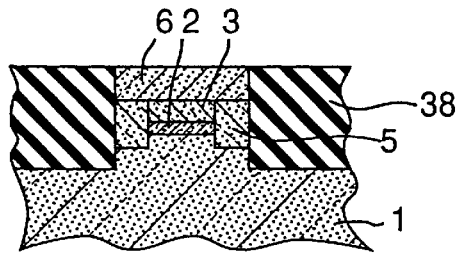
FIGS. 12A and 12B are cross sectional views of a step of the method of the prior art.
Figure 12B:
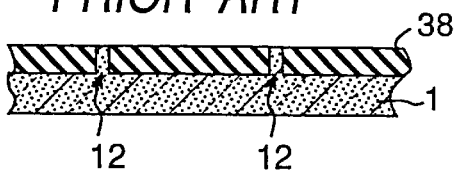
Figure 13A:
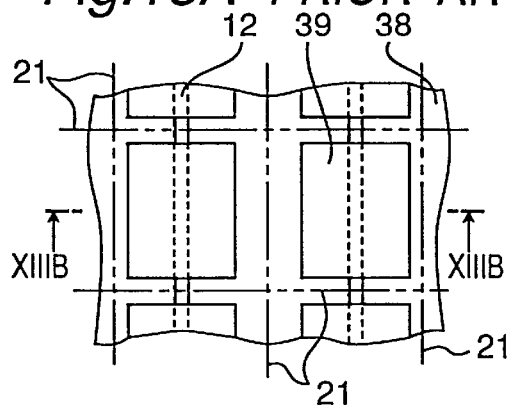
FIG. 13A is a plan view of a step of the method of the prior art.
Figure 13B:
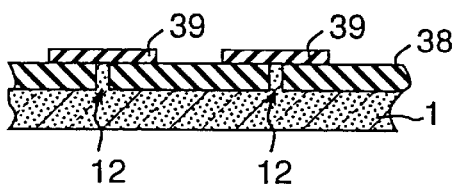
FIG. 13B is a cross sectional view along a line XIIIB—XIIIB of FIG. 13A.
Figure 14A:
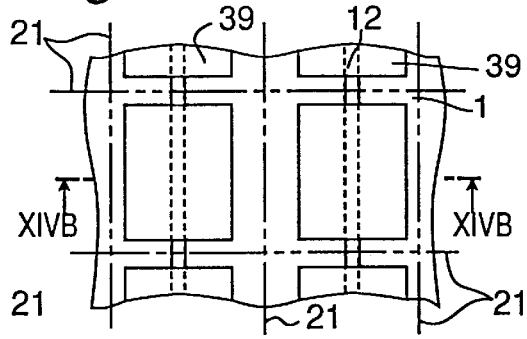
FIG. 14A is a plan view of etching in the method of the prior art.
Figure 14B:
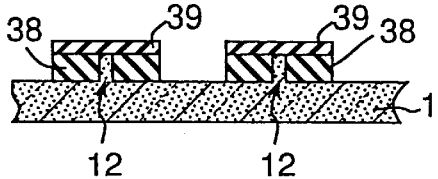
FIG. 14B is a cross sectional view along a line XIVB—XIVB of FIG. 14A.
Figure 15A:
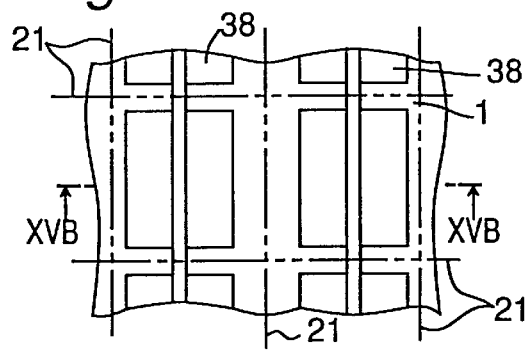
FIG. 15A is a plan view of a step in the method of the prior art.
Figure 15B:
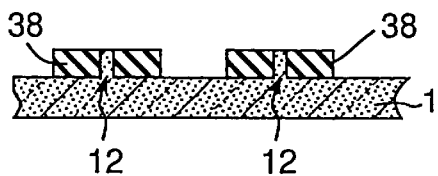
FIG. 15B is a cross sectional view along a line XVB—XVB of FIG. 15A.
Figure 16A:
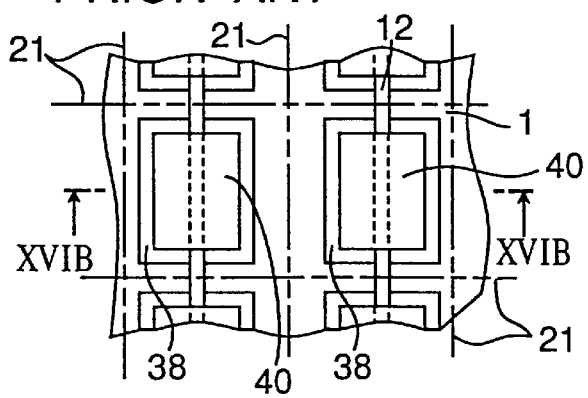
FIG. 16A is a plan view of a step in the method of the prior art.
Figure 16B:
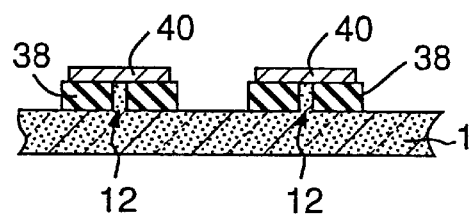
FIG. 16B is a cross sectional view along a line XVIB—XVIB of FIG. 16A.
Figure 17A:
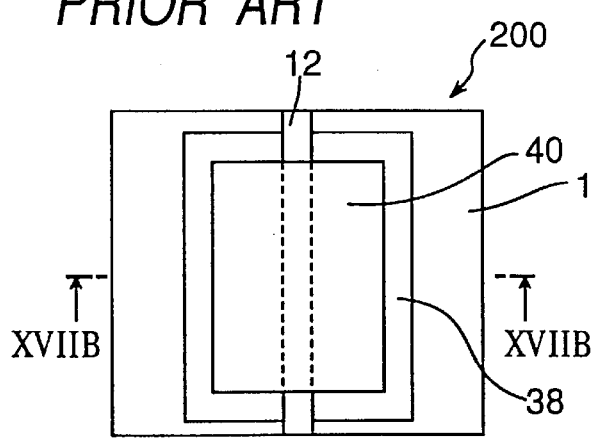
FIG. 17A is a plan view of a semiconductor device manufactured by the method of the prior art.
Figure 17B:
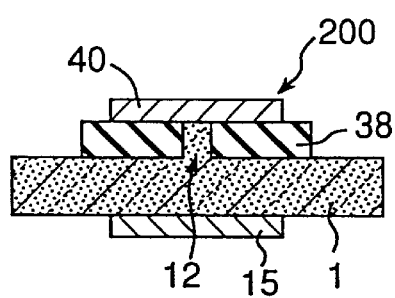
FIG. 17B is a cross sectional view along a line XVIIB—XVIIB of FIG. 17A.
Figure 18A:
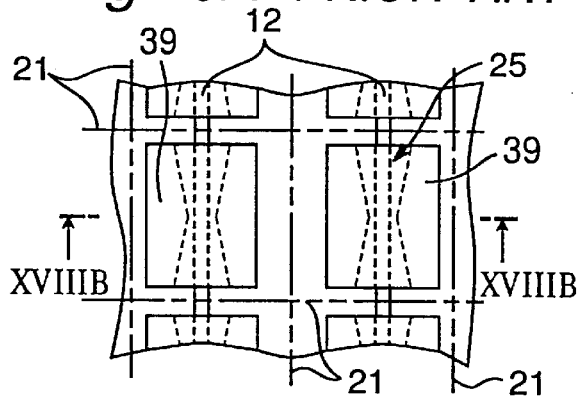
FIG. 18A is a plan view of a step in the method of the prior art.
Figure 18B:
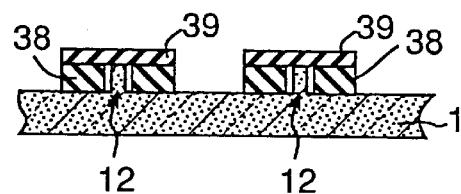
FIG. 18B is a cross sectional view along a line XVIIIB—XVIIIB of FIG. 18A.
Figure 19A:
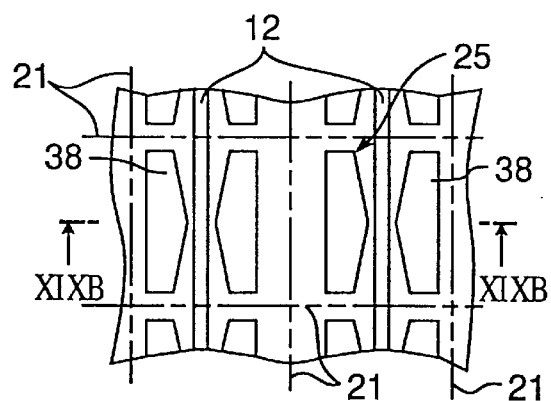
FIG. 19A is a plan view of a step in the method of the prior art.
Figure 19B:
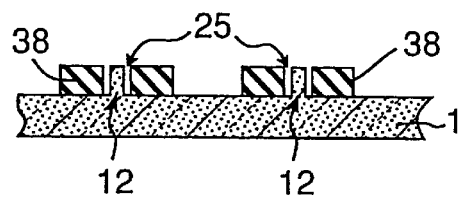
FIG. 19B is a cross sectional view along a line XIXB—XIXB of FIG. 19A.

In the second embodiment, the etching protecting pattern (b) of the insulating layer may not partially contact the ridge pattern at the borders 21 as shown in FIG. 7A. The etching protecting pattern (b) can be formed, for example, as shown in FIG. 10D (b"), wherein the organic dielectric layer covers a given area except the borderline 21; or as shown in FIG. 10E (b"'), wherein the organic dielectric layer covers an area adjacent to the borderline 21.

Dry Etching Process

Figure 3A:
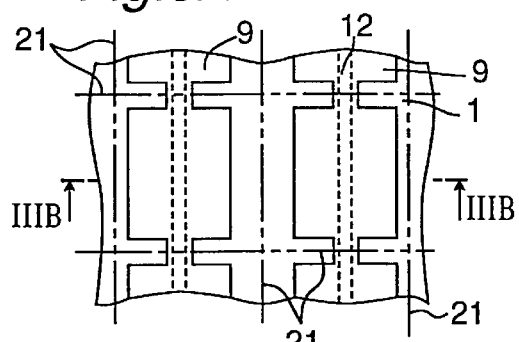
FIG. 3A is a plan view of an etching process of a method according to the present invention.
Figure 3B:
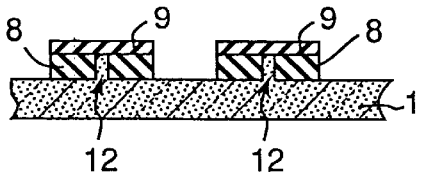
FIG. 3B shows a cross sectional view along line IIIB—IIIB of FIG. 3A.

After forming the insulating layer 9 in the certain form, the dielectric layer 8 is subjected to dry etching using the pattern of the insulating layer 9 as a mask (see FIG. 3A). In this step, dry etching may be performed by oxygen ashing under the conventional conditions. As the organic dielectric layer 8 may be etched isotropically, the size of the exposed organic dielectric layer 8, especially the area under the etching protecting pattern (b) of the insulating layer 9, may slightly decrease, e.g., less 5 to 10 μm than of the whole width of the etching protecting pattern (b), when the etching process is finished. However, the decrease in area does not have any adverse effect on the present invention.

In the second embodiment of the method according to the present invention, the insulating layer 9 may be provided in a combination of the rectangular basic insulating layer pattern (a') and the non-rectangular etching protecting pattern (b'), as shown in FIG. 7A. In the present invention, the non-rectangular etching protecting pattern (b') need not contact the ridge pattern 12 on the cleavage plane of the semiconductor substrate 1. Therefore, the insulating layer 9 can sufficiently adhere to the organic dielectric layer 8 so there are no defects due to the etching process, and, as a result, in subsequent processing, it is easier to isolate the device.

Removing the Insulating Layer

Figure 4A:
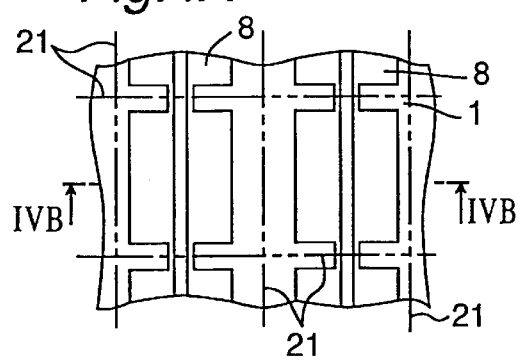
FIG. 4A is a plan view of a step in a method according to the present invention.
Figure 4B:
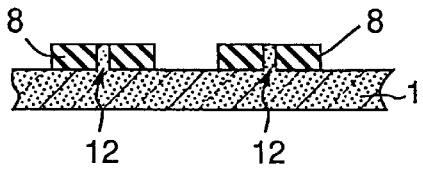
FIG. 4B is a cross sectional view along a line IVB—IVB of FIG. 4A.
Figure 5A:
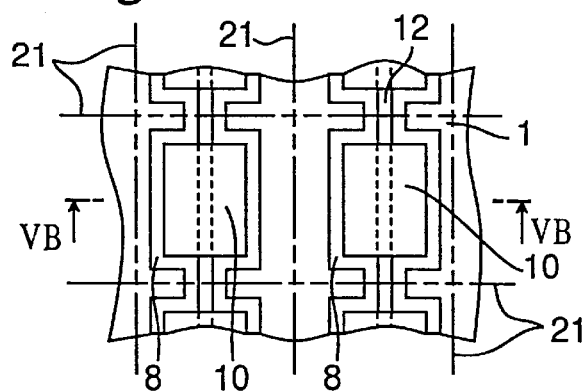
FIG. 5A is a plan view of a step in a method according to the present invention.
Figure 5B:
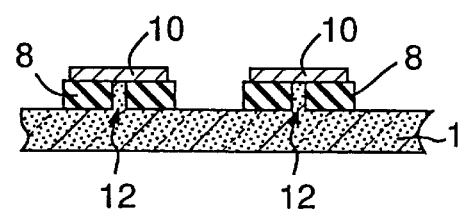
FIG. 5B is a cross sectional view along a line VB—VB of FIG. 5A.
Figure 6A:
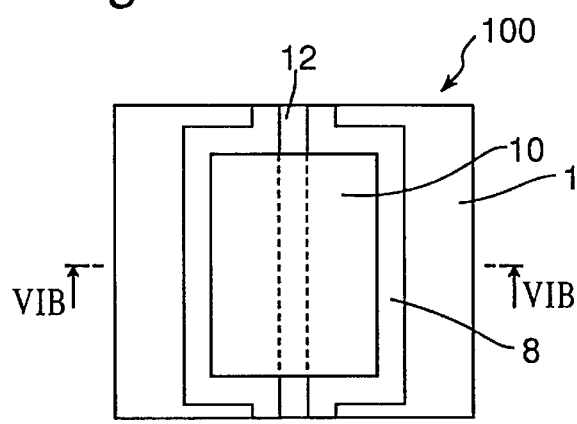
FIG. 6A is a plan view of a semiconductor device manufactured by a method according to the present invention.
Figure 6B:
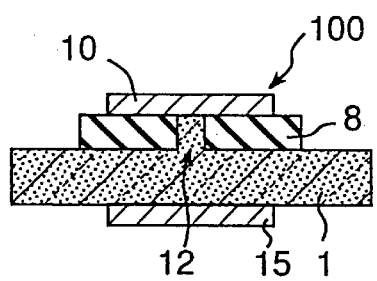
FIG. 6B is a cross sectional view along a line VIB—VIB of FIG. 6A.
Figure 9:
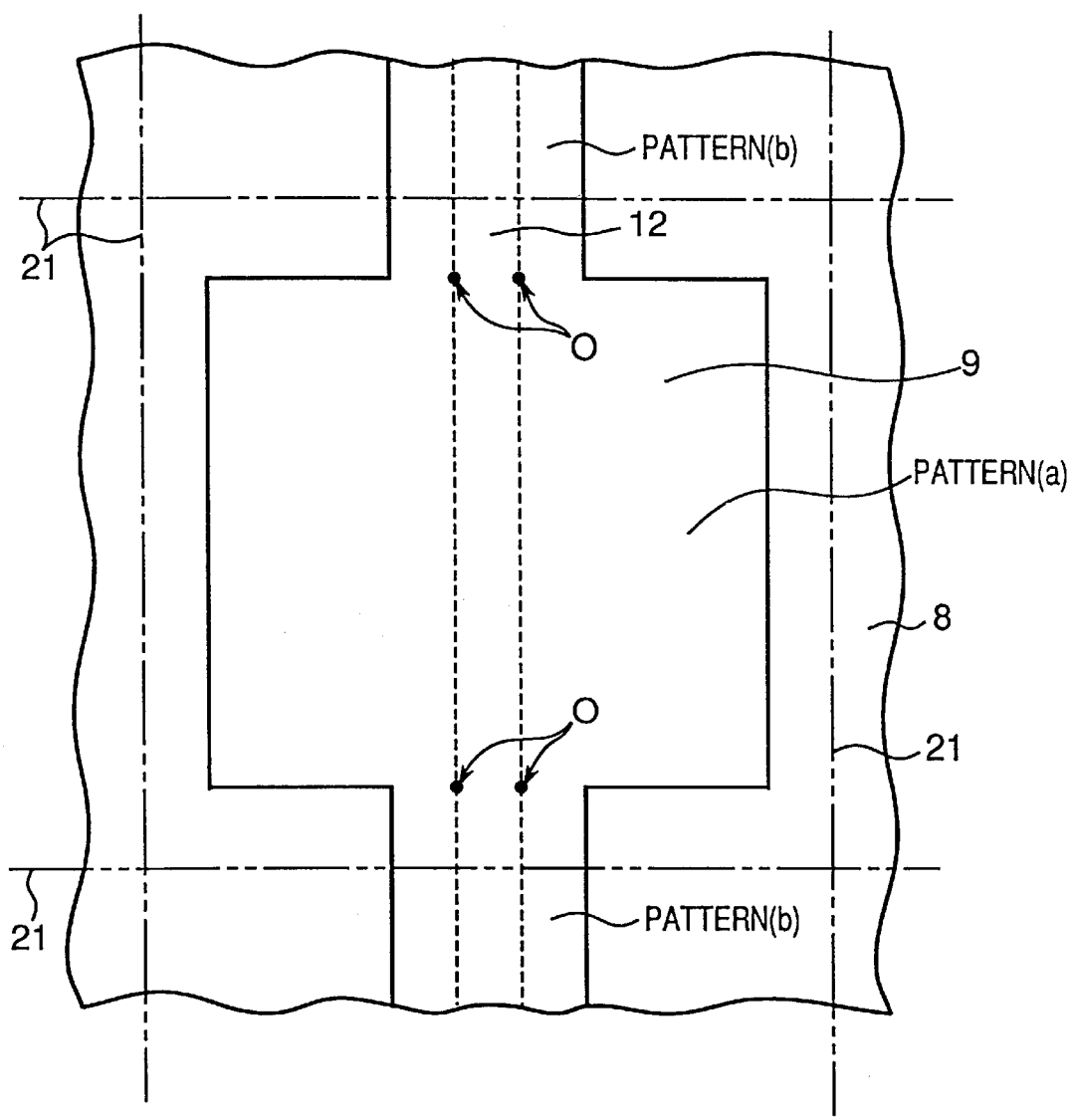
FIG. 9 is a plan view showing the basic insulating layer patterns and an etching protecting pattern formed in a method according to the present invention.

After etching, the insulating layer 9 is removed by wet etching as shown in FIGS. 4A and 4B.

Forming an Electrode

A surface electrode 10 may be formed from Cr/Au or Ti/Au on the exposed top of the ridge 12 and the organic dielectric layer 8 using a conventional technique, e.g., electron beam deposition. In addition, on the other surface of the semiconductor substrate 1, opposed to the one having the ridge pattern 1, a counter electrode 15 is provided using AuZn/Ti/Au, in the same way described above (see FIGS. 5A and 5B). The cleavage plane of the semiconductor substrate 1 may correspond with the cleaved surface of the semiconductor device, e.g., when the device is a semiconductor laser, it corresponds to a resonating surface.

Isolating of the Device

In the last step of the method according to the present invention, the area composed of the ridge pattern 12 and the pattern (a) of the organic dielectric layer 8, which corresponds to the basic insulating layer pattern (a), can be cut and separated at the borderline 21. The borderline 21 may be parallel or perpendicular to the ridge pattern to isolate a semiconductor device 100 (see in FIGS. 6A and 6B). Generally, the borderline 21 may be arranged to correspond with a cleavage plane of the semiconductor substrate 1.

The method of the present invention can provide an InP semiconductor laser with a buried p-type active layer, as well as other types of semiconductor lasers including a conductivity type semiconductor laser, a semiconductor laser using a different semiconductor substrate, a gain guide semiconductor laser, a loss guide semiconductor laser, i.e., an index guiding semiconductor laser, and the like. This method can also be utilized to provide another semiconductor device such as an optical modulator, an optical waveguide, photodiode, and the like.

In the method of the present invention, the insulating layer can be composed of the basic insulating layer pattern (a) and the etching protecting pattern (b) as shown in FIG. 2A. Therefore, in the step of dry etching in an oxygen ion plasma, incursion of an etchant from the end of the insulating layer beside the ridge pattern can be avoided. After dry etching, the ridge pattern formed by this method can also remain in contact with the organic dielectric layer without having a gap. Therefore, productivity in fabricating the desirable end product can be increased.

Furthermore, because of the high adherence of the organic dielectric layer to the ridge pattern, when isolating a device, the organic dielectric layer 8 cannot separate from the ridge pattern, so that no residue of the organic dielectric layer 8 is left on a cleaved surface of the device.

What is claimed is:

1. A method of manufacturing a semiconductor device comprising:

forming a plurality of linear ridge patterns, each linear ridge pattern having a stripe shape, in a semiconductor substrate, including forming each linear ridge pattern by successively depositing an active layer and a cladding layer on a surface of said semiconductor substrate, forming an initial ridge of said active layer and said cladding layer, forming a current blocking layer beside and contacting side surfaces of said active layer and said cladding layer of the initial ridge, and covering said cladding layer and said current blocking layer of the initial ridge with a contact layer;

filling spaces between said ridge patterns with an organic dielectric layer contacting said ridge patterns;

covering all of each of said ridge patterns and parts of said organic dielectric layer with an insulating layer having an etching protecting pattern extending along said ridge patterns for avoiding over-etching along said ridge patterns;

etching said organic dielectric layer, using said insulating layer as an etching mask, in an oxygen plasma, leaving said organic dielectric layer in the same form as said insulating layer;

removing said insulating layer;

forming respective surface electrodes on said ridge patterns and said organic dielectric layer and further forming counter electrodes corresponding to said surface electrodes on a side of said substrate opposite said active layer; and cutting said substrate along lines parallel and perpendicular to said ridge patterns to isolate a region including one of said ridge patterns and one of said electrodes, at least one of the lines corresponding to a cleavage plane of said semiconductor substrate.

2. The method according to claim 1, wherein said insulating layer includes a basic insulating layer pattern (a) and an etching protecting pattern (b), and, when a point at which said basic insulating layer pattern (a) contacts a longitudinal side of a ridge pattern is defined as an ideal point, said etching protecting pattern (b) prevents over-etching from the ideal point during oxygen etching, and said etching protecting pattern (b) has a length of at least 17.5 to 45 μm from said ideal point.

3. The method according to claim 1, wherein said etching protecting pattern (b), including a portion above said ridge pattern, has a width between 50 and 100 μm.

4. The method according to claim 1, wherein said etching protecting pattern (b) is not contiguous with said ridge pattern on the cleavage surface of said semiconductor substrate.

5. The method according to claim 1, wherein said organic dielectric layer is polyimide.

6. The method according to claim 1, wherein said organic dielectric layer has a thickness of 5.0 to 8.0 μm and said insulating layer has a thickness of 500 to 4,000 Å.

* * * * *